United States Patent
Lin

(10) Patent No.: US 6,911,233 B2
(45) Date of Patent: Jun. 28, 2005

(54) METHOD FOR DEPOSITING THIN FILM USING PLASMA CHEMICAL VAPOR DEPOSITION

(75) Inventor: Frank Lin, Hsinchu (TW)

(73) Assignee: Toppoly Optoelectronics Corp., Miaoli Hsien (TW)

( * ) Notice: Subject to any disclaimer, the term of this patent is extended or adjusted under 35 U.S.C. 154(b) by 0 days.

(21) Appl. No.: 10/064,703

(22) Filed: Aug. 8, 2002

(65) Prior Publication Data

US 2004/0028835 A1 Feb. 12, 2004

(51) Int. Cl.[7] .................................................. C23C 16/56
(52) U.S. Cl. ...................... 427/237; 427/535; 427/578; 427/579; 427/255.37; 134/1.1
(58) Field of Search .................. 134/1.1; 427/237, 427/535, 578, 579, 255.37

(56) References Cited

U.S. PATENT DOCUMENTS 5,632,821 A * 5/1997 Doi .............................. 134/1.1
5,824,375 A * 10/1998 Gupta ......................... 427/569

* cited by examiner

Primary Examiner—Timothy Meeks
(74) Attorney, Agent, or Firm—Jiang Chyun IP office

(57) ABSTRACT

A thin film deposition method using plasma enhanced chemical vapor deposition is described. In a plasma enhanced chemical vapor deposition chamber, plasma is used to enhance the chemical reaction to form a thin film on a substrate. The substrate is then removed, followed by passing a cleaning gas into the chamber to remove residues in the chamber. Before loading another batch of substrate in the chamber, a pre-deposition process is performed to isolate contaminants generated from the cleaning process. A discharge plasma treatment is then conducted to lower the amount of accumulated electrical charges.

20 Claims, 1 Drawing Sheet

METHOD FOR DEPOSITING THIN FILM USING PLASMA CHEMICAL VAPOR DEPOSITION

BACKGROUND OF INVENTION

1. Field of the Invention

The present invention relates to a deposition process for a semiconductor device. More particularly, the present invention relates to a method for depositing thin film using plasma enhanced chemical vapor deposition.

2. Description of Related Art

Currently, chemical vapor deposition is the most important process in semiconductor manufacturing for depositing a thin film. In any semiconductor device where a thin film is required, whether the thin film is conductive, semi-conductive or dielectrics, the thin film is formed by chemical vapor deposition. Chemical vapor deposition is defined as the formation of a thin film by the reaction of vapor-phase chemicals that contain the required constituents. Thus, the thin film formed by such a method is superior in crystallinity, stoichiometry and other relevant material properties.

To lower the required reaction temperature so as to reduce the thermal budget of the process, plasma enhanced chemical vapor deposition gradually becomes one of the major thin film deposition processes. Normally, in a PECVD chamber, the deposition of a thin film on a substrate includes performing the plasma enhanced chemical vapor deposition process, followed by cleaning the substrate-free chamber. A pre-deposition process is further performed to isolate contaminants generated in the cleaning of the substrate-free chamber. A next deposition process is then performed.

However, as the thin film that is being deposited on the substrate is an insulating material layer or a high resistance thin film, such as, intrinsic amorphous silicon, a large quantity of charges is accumulated on the surface of the electrode in the PECVD chamber. If thin film deposition is continued for another batch of substrate, the distribution of plasma is affected by the uneven distribution of the accumulated charges, leading to a non-uniform thickness of the depositing thin film.

SUMMARY OF INVENTION

Accordingly, the present invention provides a method for depositing thin film using plasma enhanced chemical vapor deposition, wherein the accumulated charges on the surface of the electrode in the chamber is reduced.

The present invention also provides a method for depositing thin film using plasma enhanced chemical vapor deposition, wherein the distribution of plasma being affected the uneven distribution of the accumulated charges is prevented.

The present invention further provides a method for depositing thin film using plasma enhanced chemical vapor deposition, wherein the uniformity of the thickness of the depositing thin film is improved.

Accordingly, the present invention provides a method for depositing thin film using plasma enhanced chemical vapor deposition, wherein plasma is used to enhance the chemical reaction in a PECVD chamber to form a thin film on a substrate. The substrate is then removed from the chamber. A cleaning gas is then passed into the chamber to remove residues in the chamber. A pre-deposition process is then conducted to isolate contaminants from the cleaning process before loading another substrate in the chamber. A discharge plasma treatment is further conducted, followed by loading another batch of substrate for thin film deposition by PECVD.

According to the present invention, a discharge plasma treatment is used to drastically lower the accumulated electrical charges on the electrode surface in the chamber subsequent to the pre-deposition process in order to improve the uniformity of the thickness of the deposited thin film.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
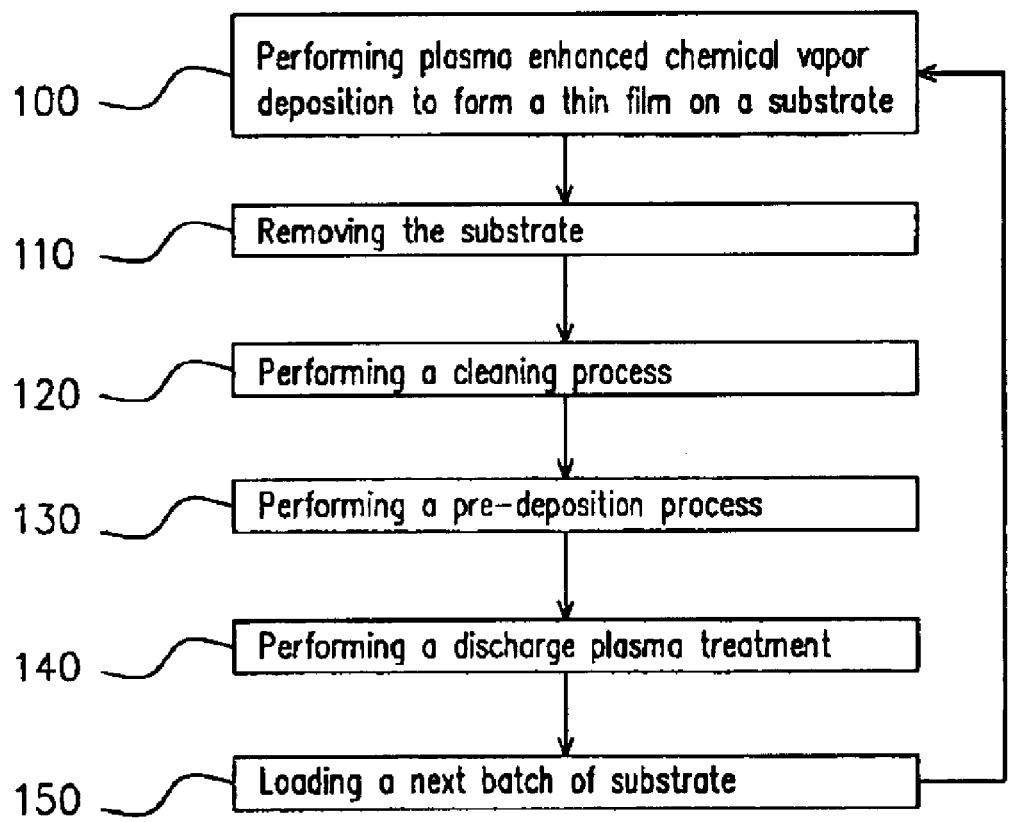
FIG. 1 is a flow diagram illustrating a method of thin film deposition using plasma enhanced chemical vapor deposition according to an embodiment of the present invention.

The present invention employs plasma enhanced chemical vapor deposition to deposit a thin film. Particularly, a discharge plasma treatment is performed after the pre-deposition process is conducted. The amount of the accumulated charges on the electrode surface in the chamber is greatly reduced to minimize the effects of the accumulated charges. The uniformity of the thickness of the thin film is thereby improved. The present invention is generally applicable in semiconductor processing, as illustrated in the following embodiment.

FIG. 1 is a flow diagram illustrating a method of thin film deposition using plasma enhanced chemical vapor deposition according to an embodiment of the present invention.

Referring to FIG. 1, in step 100, a plasma enhanced chemical vapor deposition process is performed to form a thin film on a substrate. Chemical reaction is enhanced by plasma to form a layer of thin film on the substrate that is placed in the PECVD chamber.

Thereafter, in step 110, the substrate is removed form the chamber, wherein the substrate is removed from the PECVD chamber under vacuum.

Continuing to step 120, a cleaning process is performed. A cleaning gas is passed into the chamber to remove residues using plasma enhanced chemical reaction to mitigate the problem with particles. The cleaning gas includes a fluorine-based gas, for example, $NF_3$.

In step 130, a pre-deposition process is performed. The deposition process is performed under a substrate-free condition to isolate contaminants, for example, $NF_3$, generated from the cleaning process.

In step 140, a discharge plasma treatment is conducted, especially when the depositing thin film is an insulating material or a high resistance thin film, such as, intrinsic amorphous silicon, where a large quantity of charges is accumulated on the electrode surface in the chamber, causing an uneven distribution of plasma due to the uneven distribution of the accumulated charges. The present invention, therefore, further performs a discharge plasma treatment subsequent to the pre-deposition process. The gas used in the discharge plasma treatment is selected from the group of gases consisting of $H_2$, $N_2$, Ar, He and a mixture of the above gases.

Subsequently, in step 150, another batch of substrate is loaded into the chamber and step 100 is repeated to perform the thin film deposition.

Accordingly, after the pre-deposition process of the present invention, a discharge plasma treatment is performed to reduce the accumulated charges on the electrode surface in the chamber, especially the depositing thin film is an insulation material or a high resistance thin film.

Since the present invention can lower the amount of the accumulated charges, the effect of the accumulated charges is minimized.

Further, the present invention employs a discharge plasma treatment to lower the amount of the accumulated charges, the uniformity of the thickness of the depositing thin film is thereby improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for a deposition of a thin film using a plasma enhanced chemical vapor deposition process, applicable in the deposition of the thin film on a substrate placed in a chamber, the method comprising:
   a. performing the plasma enhanced chemical vapor deposition process to form the thin film on the substrate;
   b. removing the substrate from the chamber;
   c. performing a cleaning process in the chamber without the substrate;
   d. performing a pre-deposition process to isolate contaminants;
   e. performing a discharge plasma treatment for reducing accumulated charges in the chamber;
   f. loading another batch of substrate into the chamber; and
   g. repeating step a, to step f, wherein the step c to the step e are conducted sequentially.

2. The method of claim 1, wherein performing the cleaning process includes passing a cleaning gas into the chamber.

3. The method of claim 2, wherein passing the cleaning gas into the chamber includes passing a fluorine-based cleaning gas.

4. The method of claim 3, wherein passing the fluorine-based cleaning gas includes passing a $NF_3$ gas.

5. The method of claim 1, wherein depositing the thin film includes depositing an insulation material layer.

6. The method of claim 5, wherein depositing the thin film includes depositing a high resistance thin film.

7. The method of claim 6, wherein depositing the high resistance thin film includes depositing intrinsic amorphous silicon.

8. The method of claim 1, wherein a gas used in the discharge plasma treatment includes a hydrogen gas.

9. The method of claim 8, wherein a gas used in the discharge plasma treatment includes a nitrogen gas.

10. The method of claim 1, wherein a gas used in the discharge plasma treatment includes an argon gas.

11. The method of claim 1, wherein a gas used in the discharge plasma treatment includes a helium gas.

12. The method of claim 1, wherein a gas used in the discharge plasma treatment is selected from the group consisting of a hydrogen gas, a nitrogen gas, an argon gas and a helium gas.

13. A method for a thin film deposition using a plasma enhanced chemical vapor deposition (PECVD) process, the method comprising sequentially:
   performing a plasma enhanced chemical vapor deposition (PECVD) in a chamber to form a thin film on a first batch of substrate;
   removing the first batch of substrate from the chamber;
   performing a cleaning process on the chamber;
   performing a pre-deposition process on the chamber to isolate contaminants;
   performing a discharge plasma treatment of the chamber for reducing accumulated charges in the chamber;
   placing a second batch of substrate into the chamber; and
   performing the plasma enhanced chemical vapor deposition to form the thin film on the second batch of substrate.

14. The method of claim 13, wherein performing the cleaning process includes passing a cleaning gas into the chamber.

15. The method of claim 14, wherein passing the cleaning gas into the chamber includes passing a fluorine-based cleaning gas.

16. The method of claim 15, wherein passing the fluorine-based cleaning gas includes passing a $NF_3$ gas.

17. The method of claim 13, wherein to form the thin film includes to form an insulation material layer.

18. The method of claim 13, wherein to form the thin film includes to form a high resistance thin film.

19. The method of claim 18, wherein to form the high resistance thin film includes to form intrinsic amorphous silicon.

20. The method of claim 13, wherein a gas used in the discharge plasma treatment is selected from the group consisting of a hydrogen gas, a nitrogen gas, an argon gas and a helium gas.

* * * * *